United States Patent [19]
Khoshnevisan et al.

[11] Patent Number: 5,438,231
[45] Date of Patent: Aug. 1, 1995

[54] THIN FILM MICROMECHANICAL RESONATOR GYRO

[75] Inventors: Mohsen Khoshnevisan; Manouchehr E. Motamedi, both of Newbury Park; Ratnakar R. Neurgaonkar, Thousand Oaks, all of Calif.

[73] Assignee: Rockwell International Corporation, Seal Beach, Calif.

[21] Appl. No.: 110,524

[22] Filed: Aug. 23, 1993

[51] Int. Cl.6 .............................................. H01L 41/08
[52] U.S. Cl. ..................................... 310/321; 310/366
[58] Field of Search ............... 310/321, 323, 334, 370, 310/366, 311, 330–332

[56] References Cited

U.S. PATENT DOCUMENTS

| | | | |
|---|---|---|---|
| 3,634,787 | 1/1972 | Newell | 310/321 X |
| 4,433,264 | 2/1984 | Nishiyama et al. | 310/321 |
| 4,654,663 | 3/1987 | Alsenz et al. | 340/870 |
| 4,697,116 | 9/1987 | Nakamura et al. | 310/321 X |
| 4,764,244 | 8/1988 | Chitty et al. | 310/321 X |
| 5,162,691 | 11/1992 | Mariani et al. | 310/321 |
| 5,233,259 | 8/1993 | Krishnaswamy et al. | 310/366 X |
| 5,281,888 | 1/1994 | Takeuchi et al. | 310/366 |

FOREIGN PATENT DOCUMENTS

| | | | |
|---|---|---|---|
| 0049020 | 4/1980 | Japan | 310/321 |
| 0064416 | 5/1980 | Japan | 310/321 |
| 0070117 | 5/1980 | Japan | 310/321 |

Primary Examiner—Mark O. Budd
Attorney, Agent, or Firm—H. Fredrick Hamann; George A. Montanye; Tom Streeter

[57] ABSTRACT

A method to fabricate a tuning fork resonator gyro which uses non-piezoelectric substrate structure is proposed. The tuning fork structure can be effectively rendered piezoelectric for activation and sensing by thin film deposition of a piezoelectric material. Electrical excitation of the piezo film excites vibrations in the structure of the drive tuning fork, and the gyro signal generated due to rotation can be picked up from the piezo film on the signal tuning fork. Most piezoelectric films have a much higher piezoelectric coupling than crystalline quartz, the material used in the prior art. The piezoelectric films on mechanically hard non-piezoelectric substrates are simpler for fabrication, electroding, and have a number of other advantages over the prior art. Fabrication of the tuning fork structures can be done more simply than the prior art, and deposition of the piezo films can be accomplished by sol-gel, or other thin film techniques. The proposed methods thus provide considerable flexibility to separately optimize the resonator structure in terms of the physical and mechanical properties of the structure, the required piezoelectric properties, and methods for fabrication, processing and low cost manufacturing of resonator gyros.

10 Claims, 2 Drawing Sheets

THIN FILM MICROMECHANICAL RESONATOR GYRO

BACKGROUND OF THE INVENTION

The present invention relates to resonators and has particular relation to quartz resonator gyros [1]. Pairs of such resonators are particularly useful in making small resonator gyros in which one resonator is electrically driven at a given frequency and a second resonator is mechanically driven by the first and by any rotation the second resonator is undergoing. The second resonator produces an electrical signal which can be compared with the signal driving the first resonator. The rotation can be deduced from this comparison.

FIG. 1 shows the prior art. A resonator 10 is comprised of a tuning fork 12 etched from a single crystal of quartz, supported by a base 14. Single crystal quartz is a piezoelectric material. Leads are applied to the electrodes, 18 and 16, placed on the sides and top-bottom of the tuning fork 12 respectively. The electrodes 18 and 16 are selected such that the application of an oscillating voltage to the electrodes 18 and 16 will cause the tuning fork 12 to oscillate inward and outward at the same frequency. An inverted resonator (not shown) may conveniently be placed on the underside of the base 14 and be driven by the above described resonator 10. The resonator 10 may also be used in any other application wherein electrical oscillations are to be converted to mechanical oscillations, or vice versa. A resonator of this type will generally oscillate only at a very sharply defined resonant frequency, which is often a very desirable characteristic.

FIG. 1 shows the resonator 10 in its erect position, ready for use. It is fabricated, however, in a recumbent position. A large horizontal sheet of single crystal quartz is etched into a large number or resonators. The side of the resonator upon which electrode 16 is placed is therefore the upper surface of the resonator, while the side opposite the upper surface is the lower surface. The resonator is designed to resonate inward and outward. The side of the resonator upon which electrode 18 is placed is therefore an outer surface, while the side upon which the unnumbered electrode parallel to electrode 18 is an inner surface. The side of each tine opposite an outer surface is an inner surface, and vice versa.

The prior art has a number of drawbacks. Single crystal quartz is difficult to produce and it is difficult to chemically etch. The tuning fork is generally formed from the crystal by lithography followed by long (about 20 hours) chemical etching times in caustic liquids. Anisotropic etching results in rough morphology, low yield, and low reproducibility. The entire process is expensive. The electroding process for the current devices requires electrodes on faces and walls of each tine to suppress vibrational mode crosstalk. This crosstalk to undesired modes, is introduced because the piezoelectric tensor matrix of single crystal quartz is not symmetric.

Applicants avoid the limitations of the prior art by forming the tuning fork from a non-piezoelectric material rather than from single crystal quartz. Examples of such materials are fused quartz, silicon, GaAs, or CVD diamond. Some piezoceramics are well known to have piezo coefficients (piezoelectric strain constants) 100 to 250 times that of single crystal quartz. Only a thin fill of piezoceramic, many orders of magnitude thinner than the tines of the tuning fork itself, is required to be deposited on the top and/or bottom side of the tuning fork. Because of the thin film nature of the piezo films, and the non-piezo nature of the bulk resonator substrate used in the present invention, undesired mode coupling is eliminated, and no electrodes are needed on the side walls of the tuning fork tines, as is the case in the prior art. Separation of the mechanical and piezo functions of the resonator gyros allows flexibility of optimization of each function separately and improves the device performance and low cost manufacturing.

SUMMARY OF THE INVENTION

A method to fabricate of a tuning fork resonator gyro which uses non-piezoelectric substrate for the resonating structure is proposed. The tuning fork structure can be effectively rendered piezoelectric by thin film deposition of a piezoelectric material which can be selected to be more efficient than bulk single crystal quartz. Electrical activation of the piezo film excites vibrations in the structure of the resonator tuning fork. The rotation of the gyro element generates mechanical excitations in a second (signal) tuning fork, with the amplitude proportional to the rotation rate. These resonances generate an electrical signal in the piezo film on the signal tuning fork which can be read out. Advantages over the prior art include ease of manufacture, lower cost and better performance.

Forming the resonator gyro structure from non-piezoelectric materials such as fused quartz is both cheaper and more morphologically precise than lithographically etching single crystal quartz. These advantages are not dissipated by the additional step of piezo film deposition. Some examples of the non-piezoelectric resonator structure materials are fused quartz, silicon, GaAs, aluminum oxide $Al_2O_3$, or thin diamond structures. The latter is now becoming available by diamond deposition using chemical vapor deposition (CVD), resulting in deposited diamond, which can be grown in the final shape desired. Other non-piezo material candidates also meet the requirements that the material be strong and hard (low vibrational loss), electrically insulating, and be processible to yield high Q mechanical resonator structures.

Examples of the piezoelectric materials that can be used for the piezo film on the non-piezoelectric resonator structure include piezoceramics such as lead zirconate titanate (PZT), or lead lanthanum zirconate titanate (PLZT), films of solid solutions such as strontium barium niobate (SBN) or lead barium niobate (PBN), oriented polycrystalline piezo films such as ZnO, AlN, or even organic piezoelectrics such as poly vinyl fluoride ($PVF_2$). A particularly effective method of depositing piezoceramics such as PZT or PLZT is by sol-gel techniques. The films thus produced have been shown to be strongly piezoelectric.

The thicknesses of tines of the tuning fork and the thickness of the piezo film may be controlled separately. An advantage of the proposed approach over the prior art is that it is no longer true (as is the case for single crystal quartz oscillators) that any change in the piezo force produced by changing the size of the tines will be largely offset by the concurrent change in the mass of the tines. The piezo films can thus be designed to optimize the resonances of the selected tuning fork structure. The piezo films may be deposited on both faces of the tuning fork, for increased symmetry. A single film on one face of the tuning fork will also work, and may be preferable in terms of reduced product cost.

Another advantage of the present approach is that the gyro structure can be miniaturized since the present method does not require wall electrodes. This advantage is more attractive when the non-piezoelectric substrate is either silicon or GaAs where monolithic integration is also desired. Size reduction of gyro structure may have another advantage—that resonant frequency can be increased to hundreds of KHz.

The electrode pattern on the tuning forks may be designed to optimize the electrical properties. Depending on the design, the electrode contacts can be put on one side (the outer surface) of the piezo film, or on both (inner and outer) surfaces. In case of the metal film underlayer contacts, the materials must be compatible with good oriented piezo film growth. Platinum films with a titanium buffer and gold films with a chromium buffer are particularly suitable for many piezo materials. Other thin film metals such as Al and W may also be used to form the buffer layer.

The proposed method potentially obviates the need for single crystal quartz, which involves long (~20 hours) etching times in caustic liquids, anisotropic etching (undesired faceting) of quartz resonators. It simplifies the electroding process, facilities size reduction, improves process compatibility for monolithic integration and allows mass production of resonator gyros at lower cost and better reproducibility.

DETAILED DESCRIPTION OF THE DRAWINGS

Figure 1:
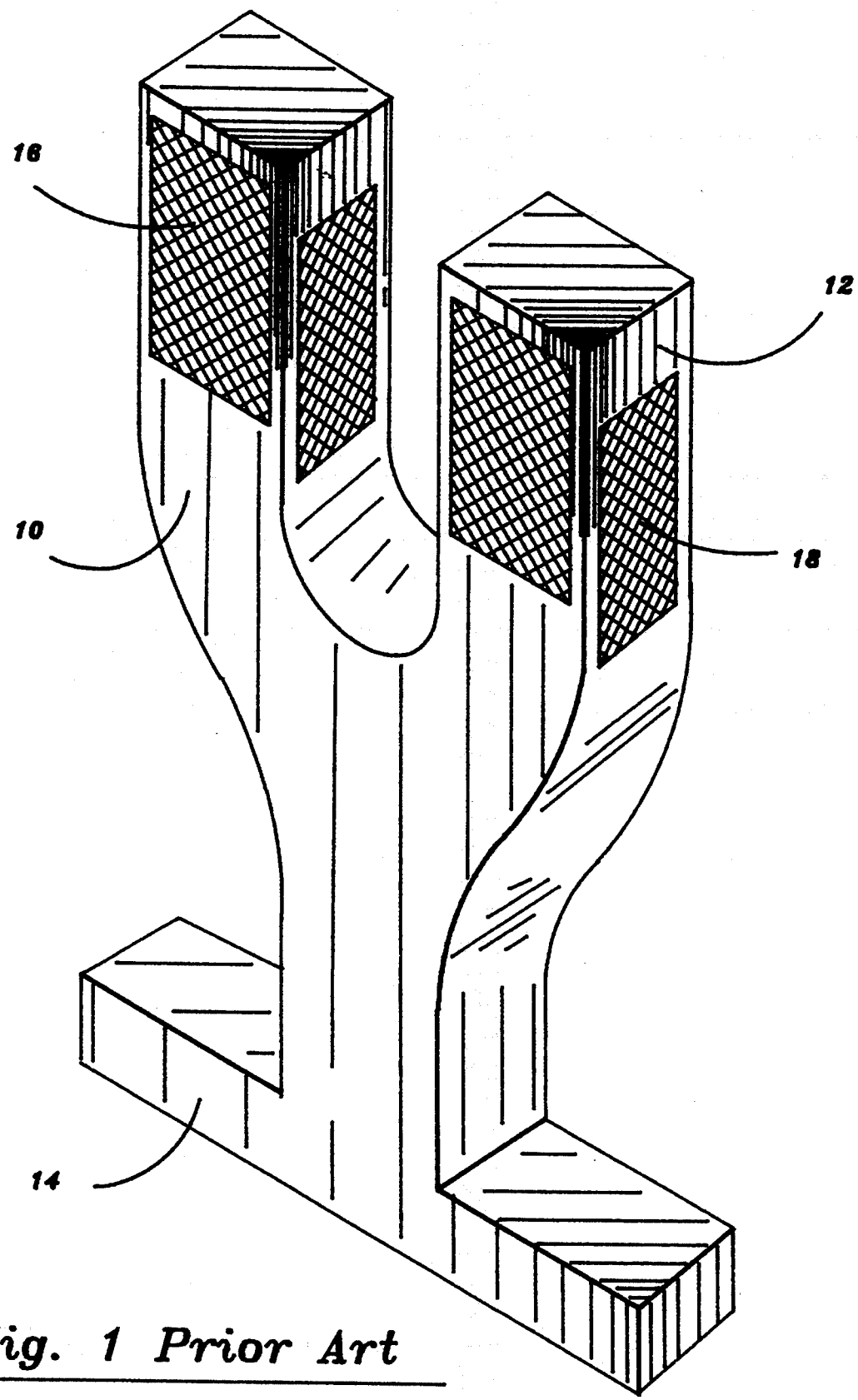
FIG. 1 A sketch of a resonator of the prior art.

FIG. 1 depicts the prior art and was discussed in the section titled "Background of the Invention."

Figure 2:
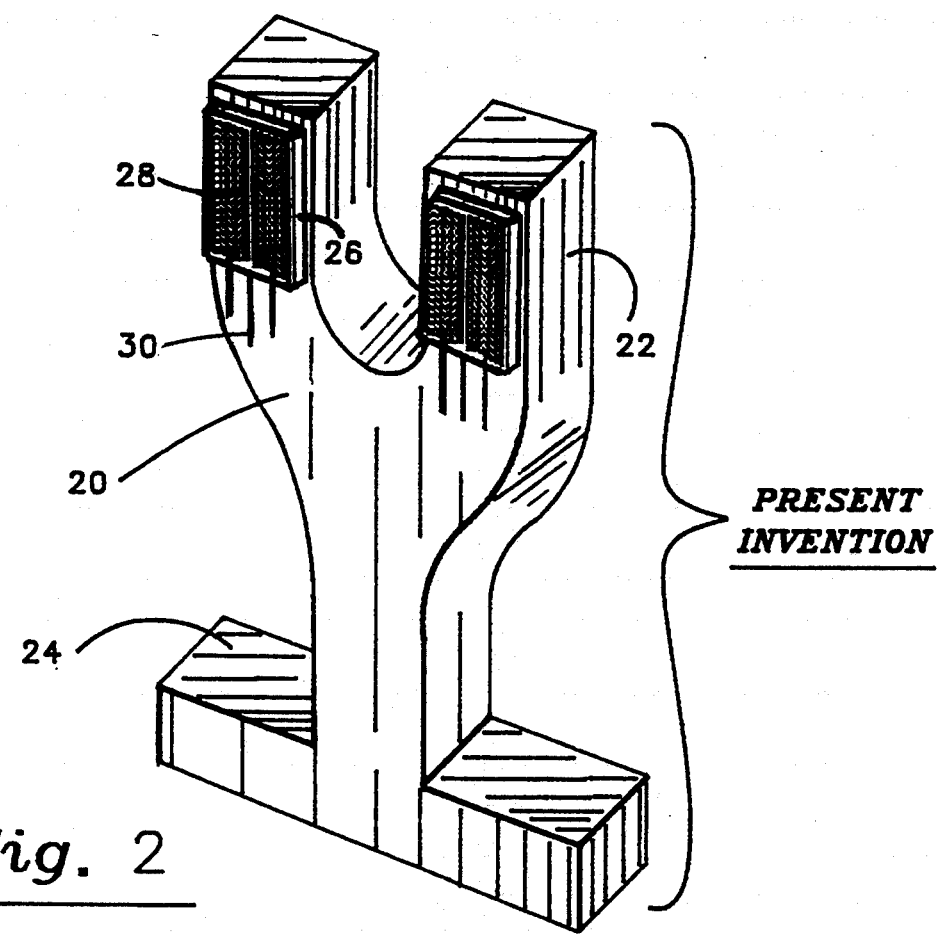
FIG. 2 A sketch of a resonator according to the present invention.
Figure 2A:
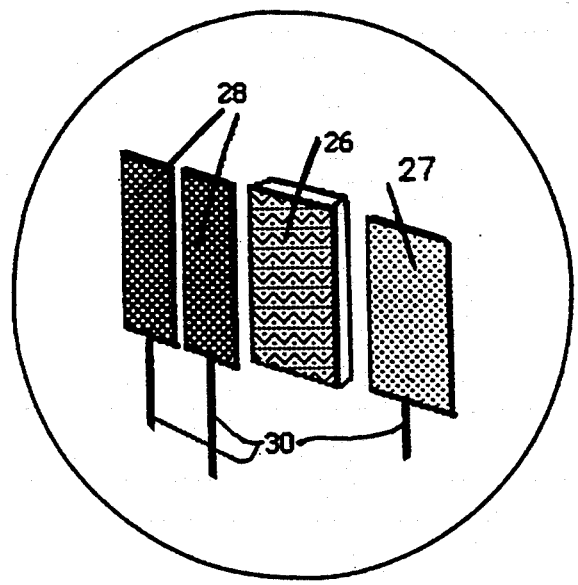

In FIG. 2, a resonator 20 includes a fused quartz (or any other non-piezoelectric substrate) tuning fork 22 supported by a base 24. A thin film 26 of piezoelectric material is deposited on the top and/or bottom of the ming fork 22. The orientation of the piezoelectric film 26 is conveniently provided by thermo-electrical or electrical poling after deposition. Leads 30 are applied to the electrodes of the thin film 26. Piezoelectric film 26 is processed between two deposited metal films 27 and 28 for ohmic contacts and electroding.

DETAILED DESCRIPTION OF THE INVENTION

The manufacture of navigation devices such as gyros from a piezoelectric bulk substrate faces problems both in device processing and control signal handling. Device processing is especially inconvenient where the piezoelectric substrate is anisotropic such as in case of crystal quartz, resulting in long etch-through times, faceted edges, nonuniformities and lower yield. In this case, the gyro device should be electroded on all four faces to compensate the effects of cross axis to gyro signals, which are the inherent properties of the crystalline quartz.

The proposed method was a non-piezoelectric resonator substrate such as fused quartz. Advantages include low cost and manufacturability when entire devices are formed by cutting out from thin plates; for example, by using lasers, or forming a mold. The final configuration is similar to the quartz single crystal structures being developed, i.e., two (resonator and signal) small tuning forks, the supporting structure, and the associated electronics. The tuning fork structure is effectively rendered piezoelectric by thin film deposition of a piezoelectric material which can be selected to be similar to, and more efficient than, single crystal quartz.

There is considerably more flexibility in design and processing of non-piezo materials for resonator structures. For example, in contrast to single crystal quartz, which has to be made in large boules by high pressure hydrothermal techniques in special enclosures, fused quartz (which is a highly polycrystalline form of quartz) can be formed by vapor deposition techniques. It can be formed into near final resonator shape over a large area, including many gyro devices. Fused quartz resonator element can also be made by sintering quartz powder into molds, or cut out the devices from sheets of fused quartz at elevated temperatures ("cookie cutter" approach). These represent major advantages in high volume manufacturing of mechanical resonator gyros.

Silicon (Si) is a mechanically hard, non-piezoelectric material with enormous industrial base as a semiconductor. Its electrical properties can be tailored as desired, and combined with its potential of monolithic integration, it is the most logical candidate as a substrate for low cost gyro devices. The silicon micromachining community (e.g., see Silicon Micromechanical Sensors and Actuators on Chip, July 1990 Issue of IEEE Spectrum) has developed high precision and scalable lithographic techniques for creating very complex Si mechanical structures. Therefore, Si is an attractive candidate material for the resonating structure in the thin film resonator gyro of this invention. Since resonator gyro devices rely on measuring extremely small currents, one special requirement for this application may be that the Si be made highly intrinsic, i.e., devoid of trapped charges which may produce capacitive parasitics which can interfere with the gyro signal processing. The Si resonator material must also be augmented with piezo films for activation and sensing. This process can be accomplished either before or after the Si is micromachined into the final resonator structure. If the piezo film is deposited on the Si before it is micromachined, the processing of the piezo material and its electrodes must be made compatible with Si micromachining process.

Another non-piezo material candidate for the resonator gyro of this invention is chemical vapor deposition (CVD) produced diamond. This recent development allows diamond film deposition into thin or very thick (millimeters) films. Moreover, diamond films can be made to grow over special areas of the substrate by prior lithography. Therefore, tuning fork mechanical resonator structures can be deposited in large numbers over a large substrate, reducing cost per element. The extraordinary mechanical properties of diamond make it a very interesting candidate for advanced micro-miniaturized gyros. Its extreme mechanical hardness will allow thinner and smaller tuning forks, operating at higher resonance frequencies, resulting in lower losses and higher sensitivity. The diamond structures would then be the substrate for growing the piezoelectric films for actuation and sensing, as proposed in this invention. Diamond is also electrically highly insulating and grows on Si very easily. Therefore, integration with Si-based signal processing electronics is enhanced.

Resonator materials can be lossy at very high frequencies, when acoustic wavelengths are comparable to grain sizes. This is not a problem with resonator gyros, since the frequencies are in tens of kHz, so the structure is expected to have high Q-factors, comparable with single crystal quartz, particularly in their currently etched morphology which is roughened by anisotropic etching. Thermal stability of the acoustic resonances of resonators fabricated in non-piezoelectric substrates is expected to be the average of the various directions in quartz and may be somewhat worse than the best directions in single crystal quartz, but still quite acceptable for many applications including gyros.

Those skilled in the art will appreciate that other non-piezoelectric materials can be used as the mechanical resonator material in the thin film resonator gyro, as proposed here. The key materials properties are its strength, hardness, electrical insulation, processibility (so that it can be mass produced cheaply), and compatibility with the selected piezoelectric film(s) to be used for electrical excitation of the resonator and readout of the rotation signals.

Our proposed method uses piezoelectric films to excite mechanical activation of the non-piezo tuning fork structure and to perform rotation signal read out. Examples include films of PZT, or PLZT or other films with relatively high piezoelectric coupling. Since the piezoelectric films of high quality can be easily prepared on any regular substrates (e.g., quartz, CVD diamond, Si, GaAs, $Al_2O_3$) with a thickness on the order of optical wavelengths, the intensive electric field that can be created means higher performance can be expected from the proposed gyro device.

Examples of the piezoelectric materials that can be used for the piezo film on the non-piezoelectric resonator structure include piezoceramics such as lead zirconate titanate (PZT), or lead lanthanum zirconate titanate (PLZT), films of solid solutions such as strontium barium niobate (SBN) or lead barium niobate (PBN), oriented polycrystalline piezo films such as ZnO, AlN, or even organic piezoelectrics such as poly vinyl fluoride ($PVF_2$). Electrical excitation of the piezo film excites vibrations in the structure of the resonator tuning fork, and the gyro signal generated in the second tuning fork due to rotation can be picked up from the piezo film on the signal tuning fork. Due to the much higher piezoelectric coefficients of films such as PZT, the films need not be extremely oriented to match or exceed quartz performance. In addition, PZT or PLZT films can be electrically or thermo-electrically poled after deposition. Deposition of the films can be accomplished in large deposition chambers, and at very low cost per item; similarly, the poling process, if needed, can be done on wafer by designing a customized probe for electrical poling to increase the productivity. Integration of structural formation, piezoceramic forming and thermomechanical poling into one continuous process is a possibility.

Among the methods for depositing piezo films on various substrates and electrodes, one with particular promise is by sol-gel process (e.g., per teachings of Guanhua Yi, et al., J. Applied Phys. 64 (5), 2717 (1988)). Depending on the design of the device, the sol-gel film may be prepared directly on the bare substrate surface, on buffer layers on the substrates or on metals such as Ti-Pt, to obtain better oriented films. Other methods involve piezo film deposition in large chambers. These processes will produce the gyro elements at low cost per item. The piezo films need to be electroded for biasing and sensing. It is also very likely that the piezoelectric films will require poling after deposition. This can be done by applying DC electric fields for a period of time, after the deposition.

The piezo films can be deposited on both faces of the tuning fork, for increased symmetry. A single film on one face of the tuning fork will also work, and may be preferable in terms of reduced product cost.

The electrode pattern on the tuning forks can be designed to optimize the electrical properties. Depending on the design, the electrode contacts can be put on one side (the outer surface) of the piezo film, or on both (inner and outer) surfaces. In case of the metal films under the piezo films for electrical contacts, the materials must be compatible with good oriented piezo film growth. Platinum films (about 0.3 $\mu$m thick) with titanium buffer (about 0.02 $\mu$m thick) for improved adhesion of the Pt are particularly suitable for many piezo materials.

Those skilled in the art will appreciate that there are many choices for piezoelectric materials, the deposition methods, and electroding, beyond those mentioned here specifically.

Mechanical simulation of the proposed method indicates that using a very high piezoelectric coupling material such as thin film PZT with a thickness on the order of 1 $\mu$m creates piezoelectric forces much higher than required for device operation. The limitation is actually set by the maximum acceptable material strain, limiting the oscillation drive amplitude. Other industrial piezoelectric materials such as ZnO can be used to fabricate microgyros operating at higher frequencies where the more fine grain boundaries are required. Diamond substrates may also prove to be the proper resonator material for higher frequency ($\sim$100 kHz) operation.

Industrial Applications

The present invention can be used wherever knowledge of single or multi-axis rotation rates is required. Expected applications are as low cost tuning fork resonant gyroscopes as rate sensors for a variety of applications where compactness, light weight, and relatively low cost are important. As rate sensors, the resonant gyros have applications to guidance, control sensors for mining and drilling, miniaturization, monolithic integration and navigation. The potential for truck, train or automotive applications will increase if the costs can be reduced, which is a major goal of the present invention.

While a particular embodiment of the present invention has been stated in some detail, the true spirit and scope of the same are not limited thereto, but are limited only by the appended claims.

What is claimed is:

1. A thin film micromechanical resonator, comprising:
   (a) a non-piezoelectric tuning fork having two tines;
   (b) a piezoelectric thin film disposed on each tine of the fork; and
   (c) at least three electrodes connected to each thin film, a first electrode being connected to a first side of each piezoelectric thin film and second and third electrodes being connected to a second side of each thin film;

such that the application of an alternating voltage to the electrodes causes the fork to resonate.

2. The resonator of claim 1, wherein the tuning fork is made of fused quartz, silicon, CVD diamond, or Al$_2$O$_3$.

3. The resonator of claim 1, wherein the piezoelectric film comprises piezoceramics such as PZT, PLZT.

4. The resonator of claim 1, wherein the piezoelectric film comprises solid solution ferroelectric oxides such as SBN, or PBN.

5. The resonator of claim 1, wherein the piezoelectric film is ZnO, AlN, or PVF$_2$.

6. A thin film micromechanical resonator, comprising:
   (a) a non-piezoelectric tuning fork having two tines;
   (b) a piezoelectric thin film disposed only on an upper surface of each tine of the fork; and
   (c) at least three electrodes connected to each thin film, a first electrode being connected to a first side of each piezoelectric thin film and second and third electrodes being connected to a second side of each thin film;

such that the application of an alternating voltage to the electrodes causes the fork to resonate.

7. The resonator claim 6, wherein the tuning fork is made of fused quartz, silicon, CVD diamond, or Al$_2$O$_3$.

8. The resonator of claim 6, wherein the piezoelectric film comprises piezoceramics such as PZT, PLZT.

9. The resonator of claim 6, wherein the piezoelectric film comprises solid solution ferroelectric oxides such as SBN, or PBN.

10. The resonator of claim 6, wherein the piezoelectric film is ZnO, AlN, or PVF$_2$.

* * * * *